(12) United States Patent
van der Wagt

(10) Patent No.: US 6,509,859 B1
(45) Date of Patent: Jan. 21, 2003

(54) METHOD AND SYSTEM FOR QUANTIZING AN ANALOG SIGNAL

(75) Inventor: Jan Paul van der Wagt, Newbury Park, CA (US)

(73) Assignee: Raytheon Company, Lexington, MA (US)

(*) Notice: Subject to any disclaimer, the term of this patent is extended or adjusted under 35 U.S.C. 154(b) by 0 days.

(21) Appl. No.: 09/938,099

(22) Filed: Aug. 22, 2001

(51) Int. Cl.[7] .................................................. H03M 1/12
(52) U.S. Cl. ......................................... 341/155; 341/136
(58) Field of Search .................................. 341/155, 133, 341/143, 156; 327/195

(56) References Cited

U.S. PATENT DOCUMENTS

| | | | |
|---|---|---|---|
| 3,569,733 A | 3/1971 | Weischedel | 307/222 |
| 3,701,148 A | 10/1972 | Frei | 340/347 AD |
| 3,815,124 A | 6/1974 | Brewer | 340/347 AD |
| 3,889,134 A | 6/1975 | Basham | 307/268 |
| 5,132,557 A | 7/1992 | Uchida et al. | 307/352 |
| 5,272,480 A | 12/1993 | Lee | 341/133 |
| 5,313,117 A | 5/1994 | Maezawa | 307/450 |
| 5,444,751 A | 8/1995 | Sage | 377/78 |
| 5,563,530 A | 10/1996 | Frazier et al. | 326/132 |
| 5,606,177 A | 2/1997 | Wallace et al. | 257/25 |
| 5,698,997 A | 12/1997 | Williamson, III et al. | 326/134 |
| 5,815,008 A | 9/1998 | Williamson, III et al. | 326/134 |
| 5,869,845 A | 2/1999 | Vander Wagt et al. | 257/25 |
| 5,874,911 A | 2/1999 | Kodama | 341/156 |
| 5,883,829 A | 3/1999 | van der Wagt | 365/159 |
| 5,930,323 A | 7/1999 | Tang et al. | 377/77 |
| 5,953,249 A | 10/1999 | van der Wagt | 365/175 |
| 6,037,819 A | 3/2000 | Broekaert | 327/291 |
| 6,229,468 B1 | 5/2001 | Broekaert | 341/133 |
| 6,292,118 B1 | 9/2001 | Broekaert | 341/133 |
| 6,348,887 B1 * | 2/2002 | Broekaert | 341/155 |
| 6,366,226 B2 | 4/2002 | Broekaert | 341/133 |
| 6,366,229 B2 | 4/2002 | Broekaert | 341/155 |

FOREIGN PATENT DOCUMENTS

| | | | |
|---|---|---|---|
| DE | 27 55 228 A1 | 6/1979 | H03C/1/54 |
| SU | 1370758 A1 | 1/1988 | H03K/5/24 |

OTHER PUBLICATIONS

Mir, S., et al, "*Unified Built–In Self–Test for Fully Differential Analog Circuits*", Journal of Electronic Testing: Theory and Applications 9, 135–151 (1996), 1996 Kluwer Academic Publishers.

Sen–Jung Wei, et al, "*A Self–Latching A/D Converter Using Resonant Tunneling Diodes*", IEEE Journal of Solid–State Circuits, vol. 28, No. 6, Jun. 1993, pp. 697–700.

Takumi Miyashita, et al., "*5 GHz E) Analog–to–Digital Converter with Polarity Alternating Feedback Comparator*", IEEE Gallium Arsenide Integrated Circuit Symposium, pp. 91–94, 1997.

Kleks, J., "*A 4–Bit Single Chip Analog to Digital Converter with A 1.0 Gigahertz Analog Input Bandwidth*", IEEE Gallium Arsenide Integrated Circuit Symposium, pp. 79–82, 1987.

(List continued on next page.)

*Primary Examiner*—Brian Young
(74) *Attorney, Agent, or Firm*—Baker Botts L.L.P.

(57) ABSTRACT

A system for quantizing an analog signal comprises a first negative-resistance device. The first negative-resistance device has a first terminal coupled through a capacitor to receive a clock signal and a second terminal coupled to receive an analog input signal. A second negative-resistance device has a first terminal coupled to receive the input signal and a second terminal coupled through a capacitor to receive an inverted clock signal. An output terminal is coupled to the second terminal of the first negative-resistance device and the first terminal of the second negative-resistance device. A quantized output signal is generated at the output terminal.

11 Claims, 2 Drawing Sheets

OTHER PUBLICATIONS

Baskin, H.B., "*N–Valued Logic Circuit*", IBM Technical Disclosure Bulletin, XP–002138968, vol. 3, No. 10, Mar. 1961—p. 81.

Sun, C.K., et al, "*A Bridge Type Optoelectronic Sample and Hold Circuit*", 1991 IEEE International Symposium on Circuits and Systems, Singapore, Jun. 11–14, 1991, cover and pp. 3003–3006.

Fushimi, Kazuo, "*Pulse Circuits Using Esaki Diodes*", Electronics and Communications in Japan, vol. 47, No. 4, Apr. 1964, XP–000907071, pp. 142–152, Scripta Technica, NY, US.

U.S. application Ser. No. 09/938,027, "*Method and System for Generating a Memory Cell*", inventors Jan Paul van der Wagt, et al, filed Aug. 22, 2001, 21 pages, and 2 sheets of drawings, Attorney Docket No. 004578.0732.

Pages 161–193 of a technical booklet pertaining to ADCs, title unknown, author(s) unknown, date unknown.

Jackson, E. M., et al, "*Proton–Induced Disorder in InP-–based Resonant Tunneling Diodes*", 11 pages, Unknown.

Van Der Wagt, J. P. A., et al, "*Ultralow Current Density RTDs for Tunneling–Based SRAM*", 4 pages, Unknown.

\* cited by examiner

US 6,509,859 B1

METHOD AND SYSTEM FOR QUANTIZING AN ANALOG SIGNAL

TECHNICAL FIELD OF THE INVENTION

This invention relates generally to electronic quantizing and more particularly to a method and system for quantizing an analog signal utilizing a resonant tunneling diode pair with a capacitively-coupled clock.

BACKGROUND OF THE INVENTION

Analog-to-digital converters have been formed in a variety of architectures. Conventionally, these architectures have been implemented with transistors. For example, one common implementation includes a cross-coupled pair of transistors. However, there are several disadvantages associated with using transistors to implement an analog-to-digital converter.

First, electronic components used in digital circuits are becoming smaller. As these devices decrease in size, quantum mechanical effects begin to appear. The electrical properties of conventional transistors may be unacceptably altered by quantum mechanical effects. Secondly, a transistor-implemented analog-to-digital converter is limited by the switching speed of the transistors, which may be too slow for some applications. Finally, conventional transistors are limited to two stable states. Thus, systems using transistors typically only convert analog signals into binary digital signals, making the use of multi-valued logic difficult.

SUMMARY OF THE INVENTION

In accordance with the present invention, a method and system for quantizing an analog signal utilizing a resonant tunneling diode pair with a capacitively-coupled clock are provided that substantially eliminate or reduce the disadvantages or problems associated with previously developed quantizers.

In one embodiment of the present invention, a system for quantizing an analog signal is provided that comprises a first negative-resistance device. The first negative-resistance device has a first terminal coupled to receive a clock signal and a second terminal coupled to receive an analog input signal. A second negative-resistance device has a first terminal coupled to receive the input signal and a second terminal coupled to receive an inverted clock signal. An output terminal is coupled to the second terminal of the first negative-resistance device and the first terminal of the second negative-resistance device. A quantized output signal is generated at the output terminal.

Technical advantages of the present invention include providing an improved method and system for quantizing an analog signal. In particular, a negative-resistance element such as a resonant tunneling diode is included as a part of the analog-to-digital converter. Accordingly, reliance on transistors is avoided. As a result, the detrimental effects of quantum mechanics are minimized or not present, switching speed is increased, and use of multi-valued logic is possible. With resonant tunneling diodes, the effects of quantum mechanics are exploited to improve performance.

Other technical advantages of the present invention will be readily apparent to one skilled in the art from the following figures, descriptions, and claims.

BRIEF DESCRIPTION OF THE DRAWINGS

For a more complete understanding of the present invention and its advantages, reference is now made to the following description taken in conjunction with the accompanying drawings.

DETAILED DESCRIPTION OF THE INVENTION

The preferred embodiments of the present invention and its advantages are best understood by referring now in more detail to FIGS. 1 through 4 of the drawings, in which like numerals refer to like parts.

Figure 1:
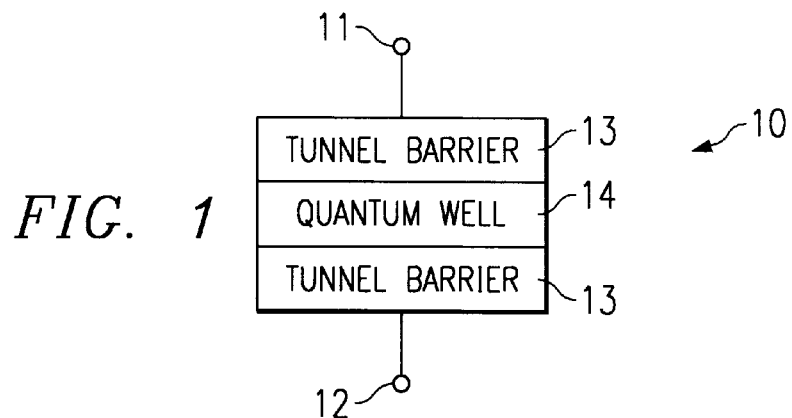
FIG. 1 is a schematic diagram of a resonant tunneling diode (RTD) for use as a negative-resistance element in accordance with the teachings of the present invention.

FIG. 1 is a schematic diagram of a resonant tunneling diode (RTD) 10 for use as a negative-resistance element in accordance with the teachings of the present invention. The RTD 10 comprises an input terminal 11 for receiving an input signal, an output terminal 12 for producing an output signal, two tunnel barrier layers 13, and a quantum well layer 14.

Figure 2:
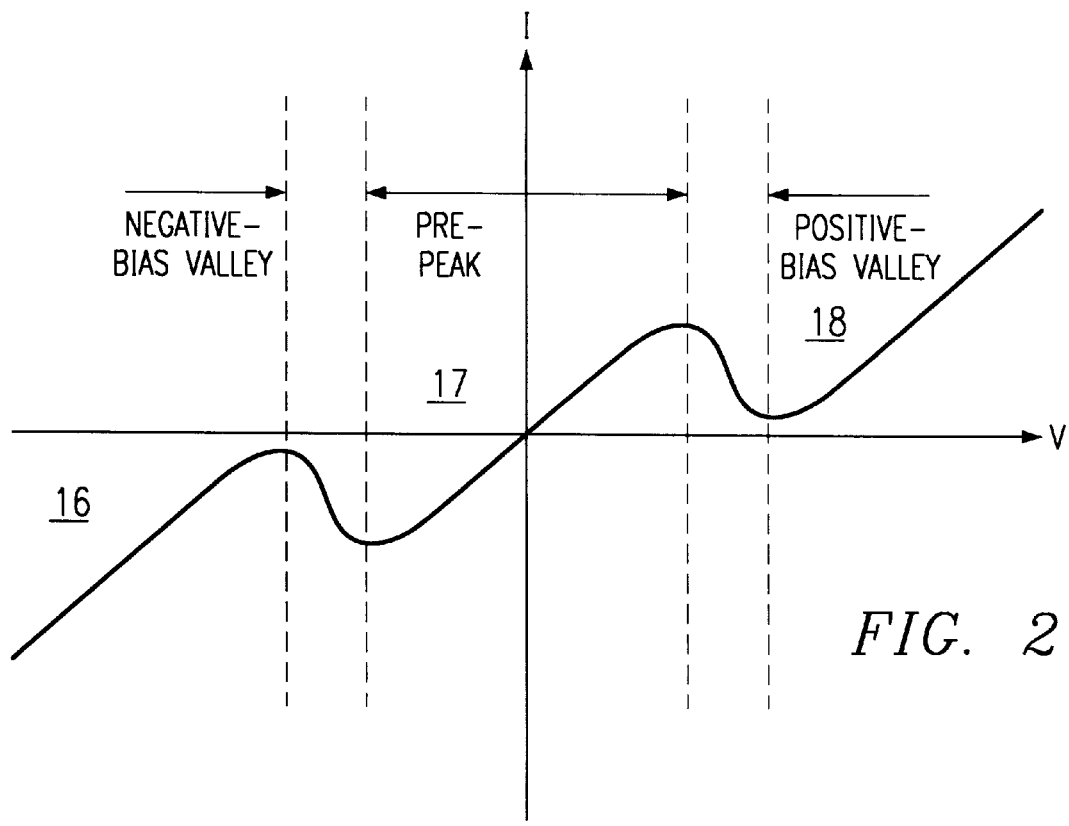
FIG. 2 is a graph of current as a function of voltage for the negative-resistance element illustrated in FIG. 1.

FIG. 2 is a graph showing current as a function of voltage for a negative-resistance element such as an RTD 10. The shape of this I-V curve is determined by the quantum effects that are a result of the extreme thinness of the tunnel barrier layers 13 and the quantum well layer 14. These layers 13 and 14 are approximately ten (10) to twenty (20) atoms thick.

When a voltage of low amplitude is applied to the input terminal 11, almost no electrons tunnel through both tunnel barrier layers 13. This results in a negligible current and the RTD 10 is switched off. As the voltage increases, the energy of the electrons received at the input terminal 11 also increases and the wavelength of these electrons decreases. This occurs because an electron's wavelength is determined by dividing Planck's constant by the electron's momentum. When a particular voltage level is reached at the input terminal 11, a specific number of electron wavelengths will fit within the quantum well layer 14. At this point, resonance is established as electrons that tunnel through one tunnel barrier layer 13 remain in the quantum well layer 14, giving those electrons opportunities to tunnel through the second tunnel barrier layer 13 to the output terminal 12. Thus, a current flow is established from the input terminal 11 to the output terminal 12 and the RTD 10 is switched on. However, if the voltage level continues to rise, eventually no electrons will have the proper wavelength to tunnel through both tunnel barrier layers 13 and the RTD 10 is switched off. This property of negative-resistance elements such as RTDs 10 that allows switching back and forth between on and off states as the voltage increases enables biasing to operate in one of three stable states, as illustrated in FIG. 2. These three stable states are the negative-bias valley region 16, the pre-peak region 17, and the positive-bias valley region 18.

Another property associated with the extreme thinness of the tunnel barrier layers 13 and the quantum well layer 14 of the RTD 10 relates to switching speed. Because each of these layers 13 and 14 are only about ten (10) to twenty (20) atoms thick, an electron only travels about 0.01 microns from the input terminal 11 to the output terminal 12. Because of this short distance, the RTD 10 switches on and off at a very high rate.

Figure 3:
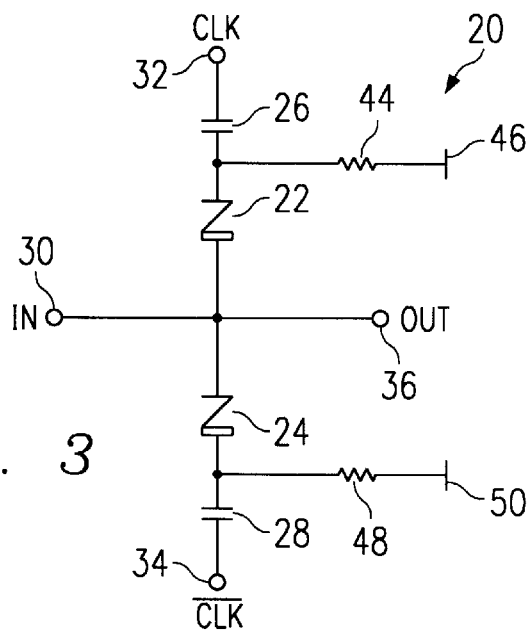
FIGS. 3 and 4 are circuit diagrams illustrating a system for quantizing an analog signal in accordance with first and second embodiments of the present invention.
Figure 4:
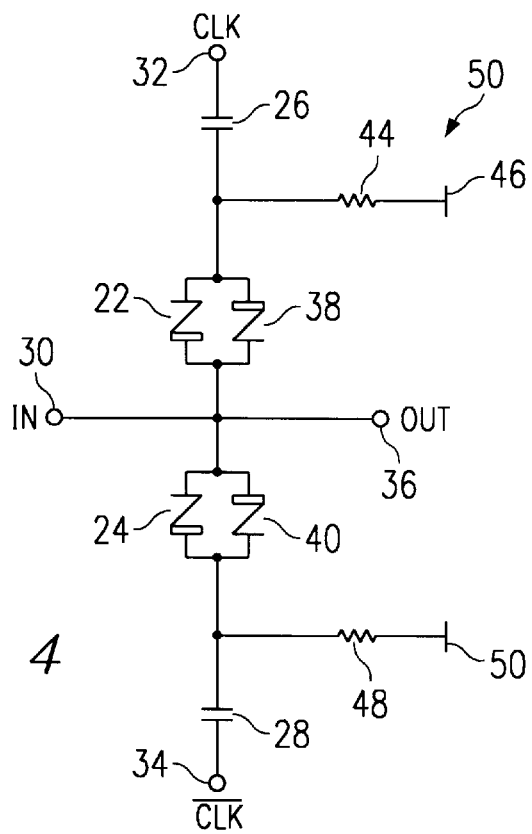

FIGS. 3 and 4 are circuit diagrams illustrating systems 20 and 50 for quantizing an analog signal in accordance with the present invention. Systems 20 and 50 comprise a first RTD 22, a second RTD 24, a first capacitor 26 and a second capacitor 28. Systems 20 and 50 also comprise an input terminal 30 for receiving an analog input signal, a clock terminal 32 for receiving a clock signal, an inverted clock terminal 34 for receiving an inverted clock signal, and an output terminal 36 having the quantized output signal.

According to one embodiment of the present invention, the input received at the input terminal 30 comprises a current varying signal, while the output at the output terminal 36 comprises a voltage varying signal. In one implementation of systems 20 and 50, the input signal varies in the X-band range (ten or more gigahertz).

In the system 20 shown in FIG. 3, the RTDs 22 and 24 are biased the same with respect to the clock terminal 32. The system 50 shown in FIG. 4 comprises a third RTD 38 and a fourth RTD 40. In this system 50, the RTDs 22 and 38 and the RTDS 24 and 40 are connected in parallel and biased oppositely to each other.

As illustrated in FIGS. 3 and 4, systems 20 and 50 also comprise a first resistor 44 and a first power supply 46 coupled to the first RTD 22 and the first capacitor 26, as well as a second resistor 48 and a second power supply 50 coupled to the second RTD 24 and the second capacitor 28. These resistors 44 and 48 and power supplies 46 and 50 provide biasing for the RTDs 22, 24, 38 and 40. According to one embodiment, the resistors 44 and 48 comprise 6 ohm resistors, the first power supply 46 comprises a positive power supply and the second power supply 50 comprises a negative power supply. It will be understood, however, that the resistors 44 and 48 may comprise other suitable resistances and the power supplies 46 and 50 may be otherwise suitably configured without departing from the scope of the present invention.

In systems 20 and 50, the RTDs 22, 24, 38 and 40 operate in the pre-peak region 17 when the input current is zero. This produces an output signal of zero voltage. However, when the input current reaches a specified level, one of the RTDs 22 or 24 or one of the RTD pairs 22 and 38 or 24 and 40 is forced by the resultant asymmetry into either the negative-bias valley region 16 or the positive-bias valley region 18. For the negative-bias valley region 16, the resulting output signal is -1. For the positive-bias valley region 18, the resulting output signal is +1.

In the embodiment shown in FIG. 3, the system 20 comprises two single RTDs 22 and 24. This embodiment provides a more compact layout and operates at a higher switching speed than the embodiment shown in FIG. 4, wherein the RTDs 22, 24, 38 and 40 are connected in parallel pairs. However, the embodiment shown in FIG. 4 provides more symmetry and reduces even-order harmonics that may exist in the embodiment shown in FIG. 3.

Although the present invention has been described with several embodiments, various changes and modifications may be suggested to the art. It is intended that the present invention encompass such changes and modifications as fall within the scope of the appended claims.

What is claimed is:

1. A system for quantizing an analog signal comprising:
   a first negative-resistance device having a first terminal and a second terminal, the second terminal coupled to receive an analog input signal;
   a second negative-resistance device having a first terminal coupled to receive the input signal and a second terminal;
   a first capacitor having a first terminal coupled to receive a clock signal and a second terminal coupled to the first terminal of the first negative-resistance device;
   a second capacitor having a first terminal coupled to the second terminal of the second negative-resistance device and a second terminal coupled to receive an inverted clock signal; and
   an output terminal coupled to the second terminal of the first negative-resistance device and the first terminal of the second negative-resistance device, a quantized output signal generated at the output terminal.

2. The system of claim 1, wherein the first and second negative-resistance devices each comprise a resonant tunneling diode.

3. The system of claim 1, further comprising means for biasing the first and second negative-resistance devices the same with respect to the clock signal.

4. The system of claim 1, wherein the first and second negative-resistance devices each comprise a first resonant tunneling diode in parallel with a second resonant tunneling diode and wherein the first resonant tunneling diode is biased oppositely to the second resonant tunneling diode.

5. A system for quantizing an analog signal comprising:
   an input terminal for receiving an analog input signal;
   a clock terminal for receiving a clock signal;
   an inverted clock terminal for receiving an inverted clock signal;
   a first capacitor having a first terminal and a second terminal, wherein the first terminal couples to the clock terminal;
   a first resonant tunneling diode having a first terminal coupled to the second terminal of the first capacitor and a second terminal coupled to the input terminal;
   a second capacitor having a first terminal and a second terminal, wherein the second terminal couples to the inverted clock terminal;
   a second resonant tunneling diode having a first terminal coupled to the input terminal and a second terminal coupled to the first terminal of the second capacitor; and
   an output terminal coupled to the second terminal of the first negative-resistance device and the first terminal of the second negative-resistance device, a quantized output signal generated at the output terminal.

6. The system of claim 5, further comprising means for biasing the first and second resonant tunneling diodes the same with respect to the clock terminal.

7. The system of claim 5, further comprising:
   a third resonant tunneling diode having a first terminal coupled to the input terminal and a second terminal coupled to the second terminal of the first capacitor to bias the first resonant tunneling diode oppositely to the third resonant tunneling diode; and
   a fourth resonant tunneling diode having a first terminal coupled to the first terminal of the second capacitor and a second terminal coupled to the input terminal to bias the second resonant tunneling diode oppositely to the fourth resonant tunneling diode.

8. A method for quantizing an analog signal comprising:
   capacitively coupling a clock signal to a first terminal of a first negative-resistance device;
   receiving an input signal at a second terminal of the first negative-resistance device;
   receiving the input signal at a first terminal of a second negative-resistance device;
   capacitively coupling an inverted clock signal to a second terminal of the second negative-resistance device; and providing a quantized output signal at an output terminal coupled to the second terminal of the first negative-resistance device and the first terminal of the second negative-resistance device.

9. The method of claim 8, wherein the first and second negative-resistance devices each comprise a resonant tunneling diode.

10. The method of claim 8, further comprising biasing the first and second negative-resistance devices the same with respect to the clock terminal.

11. The method of claim 8, wherein the first and second negative-resistance devices each comprise a first resonant tunneling diode and a second resonant tunneling diode and further comprising:

connecting the first resonant tunneling diode in parallel with the second resonant tunneling diode; and biasing the first resonant tunneling diode opposite to the second resonant tunneling device.

* * * * *

UNITED STATES PATENT AND TRADEMARK OFFICE
CERTIFICATE OF CORRECTION

PATENT NO.      : 6,509,859 B1                                          Page 1 of 1
DATED           : January 21, 2003
INVENTOR(S)     : Jan Paul van der Wagt It is certified that error appears in the above-identified patent and that said Letters Patent is hereby corrected as shown below:

<u>Column 1,</u>
Line 11, After the "RELATED APPLICATION" section insert:

-- GOVERNMENT INTEREST
    This invention was made with Government support under contract number N66001-96-C-8620 awarded by the Department of the Navy. The Government has certain rights in this invention. --.

Signed and Sealed this

Eighth Day of July, 2003

JAMES E. ROGAN
*Director of the United States Patent and Trademark Office*